US012218486B2

(12) United States Patent
Kuramoto et al.

(10) Patent No.: US 12,218,486 B2
(45) Date of Patent: Feb. 4, 2025

(54) VERTICAL CAVITY SURFACE EMITTING DEVICE

(71) Applicant: STANLEY ELECTRIC CO., LTD., Tokyo (JP)

(72) Inventors: Masaru Kuramoto, Tokyo (JP); Seiichiro Kobayashi, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 653 days.

(21) Appl. No.: 17/285,635

(22) PCT Filed: Oct. 7, 2019

(86) PCT No.: PCT/JP2019/039456
§ 371 (c)(1),
(2) Date: Apr. 15, 2021

(87) PCT Pub. No.: WO2020/080161
PCT Pub. Date: Apr. 23, 2020

(65) Prior Publication Data
US 2021/0384706 A1   Dec. 9, 2021

(30) Foreign Application Priority Data

Oct. 18, 2018   (JP) .................................. 2018-196394

(51) Int. Cl.
*H01S 5/183*   (2006.01)
*H01S 5/042*   (2006.01)
(Continued)

(52) U.S. Cl.
CPC ...... *H01S 5/18361* (2013.01); *H01S 5/04253* (2019.08); *H01S 5/1071* (2013.01); *H01S 5/34333* (2013.01); *H01S 5/34346* (2013.01)

(58) Field of Classification Search
CPC ............. H01S 5/18361; H01S 5/04253; H01S 5/1071; H01S 5/34333; H01S 5/34346;
(Continued)

(56) References Cited

U.S. PATENT DOCUMENTS 5,058,120 A * 10/1991 Nitta .................... H01S 5/2231
372/45.01
5,594,751 A * 1/1997 Scott .................... H01S 5/18333
372/92
(Continued)

FOREIGN PATENT DOCUMENTS

CN   1828959 A   9/2006
CN   101136538 A   3/2008
(Continued)

OTHER PUBLICATIONS

U.S. Appl. No. 17/285,859, First Named Inventor: Masaru Kuramoto; Title: "Vertical Cavity Surface Emitting Element"; filed Apr. 15, 2021.
(Continued)

*Primary Examiner* — Vu A Vu
(74) *Attorney, Agent, or Firm* — Holtz, Holtz & Volek PC

(57) ABSTRACT

A vertical cavity surface emitting device includes a substrate, a first multilayer film reflecting mirror on the substrate, a first semiconductor layer on the first multilayer film reflecting mirror, a light-emitting layer on the first semiconductor layer, and a second semiconductor layer on the light-emitting layer. The second semiconductor layer includes a low resistance region and a high resistance region on an upper surface. The high resistance region is depressed from the low resistance region toward the light-emitting layer outside the low resistance region and impurities of the second conductivity type are inactivated in the high resistance region such that the high resistance region has an electrical resistance higher than an electrical resistance of
(Continued)

the low resistance region. A light-transmitting electrode layer is in contact with the low resistance region and the high resistance region, and a second multilayer film reflecting mirror is on the light-transmitting electrode layer.

23 Claims, 8 Drawing Sheets

(51) Int. Cl.
  *H01S 5/10*  (2021.01)
  *H01S 5/343*  (2006.01)
(58) Field of Classification Search
  CPC .............. H01S 5/18305; H01S 5/18386; H01S 2301/166; H01S 2301/18; H01S 5/18344; H01S 5/18308; H01S 5/18341; H01S 5/2009; H01S 5/18369
  USPC ........................................................ 372/50.11
  See application file for complete search history.

(56) References Cited

U.S. PATENT DOCUMENTS

| | | | |
|---|---|---|---|
| 5,625,637 A | 4/1997 | Mori et al. | |
| 5,915,165 A | 6/1999 | Sun et al. | |
| 6,266,356 B1 | 7/2001 | Kaneko | |
| 6,376,269 B1 | 4/2002 | Chen et al. | |
| 6,396,865 B1 | 5/2002 | Mawst et al. | |
| 6,403,983 B1 | 6/2002 | Mizuno | |
| 6,507,595 B1 | 1/2003 | Kapon et al. | |
| 6,546,029 B2 * | 4/2003 | Sirbu ................. | B82Y 20/00 372/45.01 |
| 6,621,843 B2 * | 9/2003 | Yoo ................... | H01S 5/18308 372/45.01 |
| 6,750,071 B2 | 6/2004 | Chirovsky et al. | |
| 6,751,245 B1 | 6/2004 | Wasserbauer et al. | |
| 6,876,687 B2 * | 4/2005 | Zhu ................... | H01S 5/18316 372/45.01 |
| 7,251,262 B2 | 7/2007 | Kuwata | |
| 7,439,550 B2 | 10/2008 | Tomioka et al. | |
| 7,596,163 B2 | 9/2009 | Yoshikawa et al. | |
| 7,986,722 B2 * | 7/2011 | Higuchi ............. | H01S 5/18341 372/87 |
| 8,030,666 B2 * | 10/2011 | Chen ................. | H01L 21/02381 257/E33.025 |
| 8,488,644 B2 * | 7/2013 | Imai ................... | H01S 5/18341 438/542 |
| 8,855,157 B2 * | 10/2014 | Higuchi ............. | H01S 5/18341 372/45.01 |
| 9,935,427 B2 | 4/2018 | Tazawa et al. | |
| 9,972,972 B2 | 5/2018 | Tazawa et al. | |
| 10,381,804 B2 | 8/2019 | Tazawa et al. | |
| 10,483,721 B2 | 11/2019 | Tazawa et al. | |
| 10,554,846 B2 * | 2/2020 | Kondo ............... | G03G 15/04036 |
| 10,681,474 B2 * | 6/2020 | Fishman ............ | H01S 5/04256 |
| 10,892,601 B2 | 1/2021 | Kuramoto et al. | |
| 11,095,096 B2 * | 8/2021 | Han ................... | H01S 5/18311 |
| 11,563,306 B2 | 1/2023 | Moench et al. | |
| 2001/0028667 A1 | 10/2001 | Kaneko | |
| 2001/0038655 A1 | 11/2001 | Tanaka et al. | |
| 2004/0179566 A1 * | 9/2004 | El-Bahar ............ | B82Y 20/00 372/45.01 |
| 2005/0089075 A1 | 4/2005 | Baba et al. | |
| 2005/0147143 A1 | 7/2005 | Jikutani | |
| 2007/0025407 A1 * | 2/2007 | Koelle ............... | H01S 5/18308 372/36 |
| 2007/0071054 A1 | 3/2007 | Takahashi | |
| 2007/0153863 A1 | 7/2007 | Mochizuki | |
| 2007/0258499 A1 | 11/2007 | Mochizuki | |
| 2008/0219307 A1 | 9/2008 | Birkedal et al. | |
| 2008/0279241 A1 | 11/2008 | Oki et al. | |
| 2009/0041075 A1 | 2/2009 | Hashimoto | |
| 2009/0180509 A1 | 7/2009 | Kise et al. | |
| 2009/0268774 A1 | 10/2009 | Oki et al. | |
| 2010/0054290 A1 | 3/2010 | Hatakeyama | |
| 2011/0176572 A1 | 7/2011 | Moser et al. | |
| 2012/0008658 A1 | 1/2012 | Chung | |
| 2012/0307855 A1 | 12/2012 | Chitica | |
| 2013/0188659 A1 | 7/2013 | Kondo et al. | |
| 2017/0093128 A1 * | 3/2017 | Fattal ................. | H01S 5/18363 |
| 2018/0115140 A1 * | 4/2018 | Tazawa .............. | H01S 5/1231 |
| 2018/0366906 A1 | 12/2018 | Hamaguchi et al. | |
| 2019/0086831 A1 | 3/2019 | Kondo | |
| 2019/0245318 A1 | 8/2019 | Lacomb et al. | |
| 2019/0267774 A1 | 8/2019 | Sato et al. | |
| 2019/0363515 A1 | 11/2019 | Kuramoto et al. | |
| 2020/0185882 A1 | 6/2020 | Zhao et al. | |
| 2021/0104870 A1 | 4/2021 | Sato et al. | |
| 2021/0111538 A1 | 4/2021 | Takeuchi et al. | |
| 2021/0351568 A1 | 11/2021 | Kuramoto | |
| 2021/0384706 A1 | 12/2021 | Kuramoto et al. | |
| 2022/0140570 A1 | 5/2022 | Kuramoto et al. | |
| 2022/0149595 A1 | 5/2022 | Kuramoto et al. | |
| 2022/0368107 A1 | 11/2022 | Tazawa et al. | |
| 2024/0146026 A1 | 5/2024 | Yokozeki et al. | |

FOREIGN PATENT DOCUMENTS

| | | |
|---|---|---|
| EP | 0944142 A1 | 9/1999 |
| EP | 1811620 A2 | 7/2007 |
| EP | 3869643 A1 | 8/2021 |
| JP | H04363081 A | 12/1992 |
| JP | H0918084 A | 1/1997 |
| JP | H11121864 A | 4/1999 |
| JP | 2000196189 A | 7/2000 |
| JP | 2000252584 A | 9/2000 |
| JP | 2003163373 A | 6/2003 |
| JP | 2004119831 A | 4/2004 |
| JP | 2005197426 A | 7/2005 |
| JP | 2005311175 A | 11/2005 |
| JP | 2009246194 A | 10/2009 |
| JP | 2011205006 A | 10/2011 |
| JP | 2012517705 A | 8/2012 |
| JP | 2013175712 A | 9/2013 |
| JP | 5707742 B2 | 4/2015 |
| JP | 2015525976 A | 9/2015 |
| JP | 6369613 B1 | 8/2018 |
| JP | 2019208004 A | 12/2019 |
| WO | 0245223 A1 | 6/2002 |
| WO | 2007116659 A1 | 10/2007 |
| WO | 2009119172 A1 | 10/2009 |
| WO | 2014018942 A1 | 1/2014 |
| WO | 2017018017 A1 | 2/2017 |
| WO | 2018083877 A1 | 5/2018 |
| WO | 2018180450 A1 | 10/2018 |
| WO | 2018184288 A1 | 10/2018 |
| WO | 2020080160 A1 | 4/2020 |
| WO | 2020080161 A1 | 4/2020 |
| WO | 2020170818 A1 | 8/2020 |

OTHER PUBLICATIONS

International Search Report (ISR) (and English translation thereof) dated Dec. 24, 2019 issued in International Application No. PCT/JP2019/039456.
Written Opinion dated Dec. 24, 2019 issued in International Application No. PCT/JP2019/039456.
Extended European Search Report (EESR) dated Jun. 22, 2022, issued in counterpart European Application No. 19872622.6.
U.S. Appl. No. 17/285,859, filed Apr. 15, 2021.
U.S. Appl. No. 17/432,470, filed Aug. 19, 2021.
Chinese Office Action (and an English language translation thereof) dated Nov. 17, 2023, issued in counterpart Chinese Application No. 201980068567.3.
Extended European Search Report (EESR) dated Jun. 22, 2022, issued in counterpart European Application No. 19874482.3.
International Search Report (ISR) (and English translation thereof) dated May 12, 2020 issued in International Application No. PCT/JP2020/004314.

(56) References Cited

OTHER PUBLICATIONS

Extended European Search Report (EESR) dated Oct. 28, 2022, issued in counterpart European Application No. 20760005.7.
International Search Report (ISR) (and English translation thereof) dated Dec. 24, 2019 issued in International Application No. PCT/JP2019/039455.
Japanese Office Action (and an English language translation thereof) dated Feb. 14, 2023, issued in Japanese Application No. 2019-029294.
Related U.S. Appl. No. 17/285,859; First Named Inventor: Masaru Kuramoto; Title: "Vertical Cavity Surface Emitting Device"; filed Apr. 15, 2021.
U.S. Appl. No. 17/432,466; First Named Inventor: Masaru Kuramoto; Title: "Vertical Cavity Surface Emitting Device"; filed Aug. 19, 2021.
Related U.S. Appl. No. 17/432,470, First Named Inventor: Masaru Kuramoto; Title: "Vertical Cavity Surface Emitting Device"; filed Aug. 19, 2021.
Written Opinion dated Dec. 24, 2019 issued in International Application No. PCT/JP2019/039455.
Written Opinion dated May 12, 2020 issued in International Application No. PCT/JP2020/004314.
Chinese Office Action (and an English language translation thereof) dated Jan. 23, 2024, issued in Chinese Application No. 202080015430.4 (which is a counterpart of related U.S. Appl. No. 17/432,470).
Chinese Office Action (and an English language translation thereof) dated Nov. 20, 2023, issued in Chinese Application No. 201980068659.1 (which is a counterpart of related U.S. Appl. No. 17/285,859).
Office Action (Non-Final) dated May 2, 2024, issued in related U.S. Appl. No. 17/285,859.
Chinese Search Report (and an English translation thereof) dated Apr. 11, 2024, issued in Chinese Application No. 201980068659.1 (which is a counterpart of related U.S. Appl. No. 17/285,859).
Chinese Search Report (and an English translation thereof) dated May 31, 2024, issued in Chinese Application No. 2020800154304 (which is a counterpart of related U.S. Appl. No. 17/432,470).
Office Action (Non-Final Rejection) dated Jun. 6, 2024, issued in related U.S. Appl. No. 17/432,470.
Office Action (Non-Final) dated Nov. 22, 2023, issued in related U.S. Appl. No. 17/285,859.
1 Office Action (Final Rejection) dated Oct. 31, 2024, issued in related U.S. Appl. No. 17/285,859.

\* cited by examiner

| Measurement Conditions | Resonator Length: $OL1 = 10 \times \lambda$<br>Width of convex part: $W1 = \Phi 6 \, [\mu m]$<br>Refractive index difference:<br>$\Delta n ((n1-n2)/n1) = 1.5 \times 10^{-3}$ | | |
|---|---|---|---|
| Driving current value | 4.4 mA | 6 mA | 7.6 mA |
| Optical output value | 1.06 mW | 2.04 mW | 3.06 mW |
| Half-value angle (vertical) | 4.3° | 4.8° | 4.0° |
| Half-value angle (horizontal) | 4.2° | 4.3° | 3.8° |
| Far-field patterns | | | |
| Driving current value | 8.9 mA | 10.3 mA | 11.5 mA |
| Optical output value | 4.06 mW | 5.17 mW | 6.19 mW |
| Half-value angle (vertical) | 5.0° | 5.1° | 6.0° |
| Half-value angle (horizontal) | 5.3° | 5.8° | 6.9° |
| Far-field patterns | | | |

FIG.8

VERTICAL CAVITY SURFACE EMITTING DEVICE

TECHNICAL FIELD

The present invention relates to a vertical cavity surface emitting device, such as a vertical cavity surface emitting laser.

BACKGROUND ART

The vertical cavity surface emitting laser (hereinafter simply referred to as a surface emitting laser) is a semiconductor laser that includes reflecting mirrors formed of multilayer films stacked on a substrate and emits light in a direction perpendicular to a surface of the substrate. For example, Patent Document 1 discloses a surface emitting laser using a nitride semiconductor.

Patent Document 1: Japanese Patent No. 5707742

DISCLOSURE OF THE INVENTION

Problems to be Solved by the Invention

For example, in the vertical cavity surface emitting device, such as the surface emitting laser, it is preferred that a light emission pattern is stable, for example, a far-field pattern is stable. Accordingly, for example, a resonator configured to generate light in a desired transverse mode is preferably configured in the vertical cavity surface emitting device. For example, generating a laser beam in a single transverse mode allows obtaining a far-field pattern of unimodal laser beam having a high-output power.

The surface emitting laser or the like is preferably high quality. For example, early deterioration is preferably little, and in a case where the surface emitting laser is used under various kinds of environments, for example, during an operation at a high temperature, the surface emitting laser can preferably perform stable output. Generally, a light-emitting device preferably has a simple configuration and can be easily manufactured at low cost.

The present invention has been made in consideration of the above-described points and an object of which is to provide a vertical cavity surface emitting device configured to emit light in a stable transverse mode and having a simple configuration and a high quality.

Solutions to the Problems

A vertical cavity surface emitting device according to the present invention includes a substrate, a first multilayer film reflecting mirror formed on the substrate, a first semiconductor layer formed on the first multilayer film reflecting mirror and having a first conductivity type, a light-emitting layer formed on the first semiconductor layer, and a second semiconductor layer formed on the light-emitting layer and having a second conductivity type opposite to the first conductivity type of the first semiconductor layer. The second semiconductor layer includes a low resistance region and a high resistance region on an upper surface. The high resistance region is depressed from the low resistance region toward the light-emitting layer outside the low resistance region and impurities of the second conductivity type is inactivated in the high resistance region such that the high resistance region has an electrical resistance higher than an electrical resistance of the low resistance region. The vertical cavity surface emitting device includes a light-transmitting electrode layer in contact with the low resistance region and the high resistance region, the light-transmitting electrode layer being formed on the upper surface of the second semiconductor layer, and a second multilayer film reflecting mirror formed on the light-transmitting electrode layer. A resonator is constituted between the second multilayer film reflecting mirror and the first multilayer film reflecting mirror.

BRIEF DESCRIPTION OF THE DRAWINGS

FIG. 8 is a drawing illustrating actually measured examples of a far-field pattern of light emitted from the surface emitting laser according to Embodiment 1.

DESCRIPTION OF PREFERRED EMBODIMENTS

The following will describe embodiments of the present invention in detail. In the following embodiments, a case where the present invention is embodied as a surface emitting laser (semiconductor laser) will be described. However, the present invention is not limited to the surface emitting laser but applicable to various kinds of vertical cavity surface emitting devices, such as a vertical cavity surface emitting diode.

Embodiment 1

Figure 1:
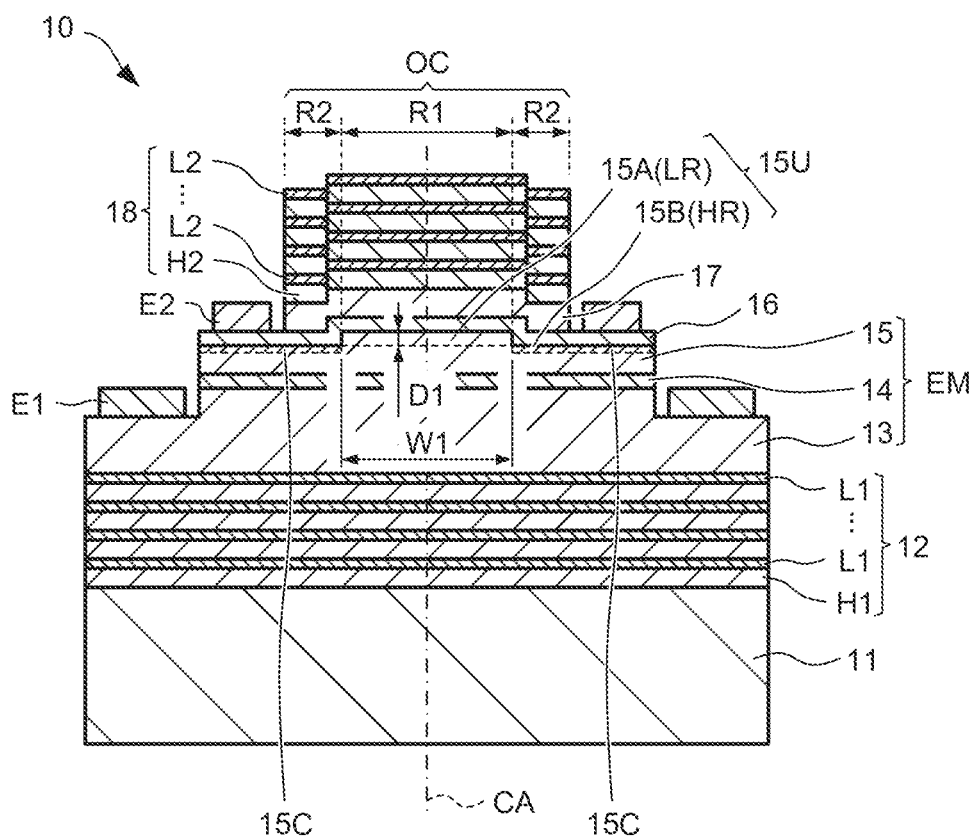
FIG. 1 is a cross-sectional view of a surface emitting laser according to Embodiment 1.
Figure 2:
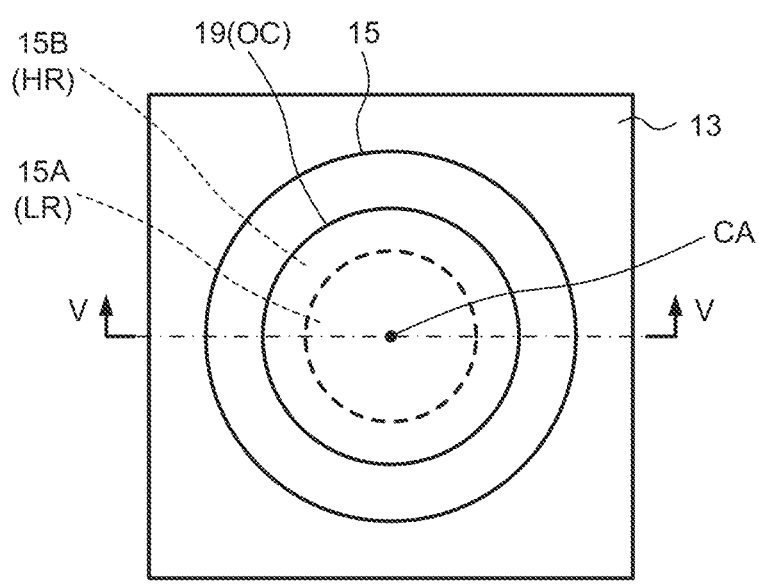
FIG. 2 is a schematic top view of the surface emitting laser according to Embodiment 1.

FIG. 1 is a cross-sectional view of a Vertical Cavity Surface Emitting Laser (hereinafter referred to as a surface emitting laser: VCSEL) according to Embodiment 1. FIG. 2 is a schematic top view of a surface emitting laser 10. FIG. 1 is a cross-sectional view taken along the line V-V in FIG. 2. The configuration of the surface emitting laser 10 will be described with reference to FIG. 1 and FIG. 2.

The surface emitting laser 10 includes a substrate 11 and a first multilayer film reflecting mirror (hereinafter simply referred to as a first reflecting mirror) 12 formed on the substrate 11. In this embodiment, the first reflecting mirror 12 is formed on the substrate 11 and has a structure in which first semiconductor films (hereinafter referred to as high refractive index semiconductor films) H1 and second semiconductor films (hereinafter referred to as low refractive index semiconductor films) L1 having a refractive index lower than that of the high refractive index semiconductor film H1 are stacked in alternation.

That is, in this embodiment, the first reflecting mirror 12 is a semiconductor multilayer film reflecting mirror constituting a Distributed Bragg Reflector (DBR) made of a semiconductor material.

In this embodiment, the substrate 11 has a composition of GaN. The substrate 11 is a substrate for growth used for crystal growth of the first reflecting mirror 12. The high refractive index semiconductor layer H1 in the first reflecting mirror 12 has a composition of GaN, and the low refractive index semiconductor layer L1 has a composition of AlInN. In this embodiment, between the substrate 11 and the first reflecting mirror 12, a buffer layer (not illustrated) having a composition of GaN is disposed.

The surface emitting laser 10 includes a light-emitting structure layer EM formed on the first reflecting mirror 12 and including a light-emitting layer 14. In this embodiment, the light-emitting structure layer EM includes a plurality of semiconductor layers made of a nitride-based semiconductor. The light-emitting structure layer EM includes a n-type semiconductor layer (first semiconductor layer) 13 formed on the first reflecting mirror 12, the light-emitting layer (active layer) 14 formed on the n-type semiconductor layer 13, and a p-type semiconductor layer (second semiconductor layer) 15 formed on the light-emitting layer 14.

In this embodiment, the n-type semiconductor layer 13 has a composition of GaN and contains Si as n-type impurities. The light-emitting layer 14 has a quantum well structure that includes a well layer having a composition of InGaN and a barrier layer having a composition of GaN. A p-type semiconductor layer 15 has a GaN-based composition and contains Mg as p-type impurities.

The configuration of the light-emitting structure layer EM is not limited to this. For example, the n-type semiconductor layer 13 may include a plurality of n-type semiconductor layers having mutually different compositions. The p-type semiconductor layer 15 may include a plurality of p-type semiconductor layers having mutually different compositions.

For example, the p-type semiconductor layer 15 may include, for example, an AlGaN layer as an electron-blocking layer (not illustrated) that reduces an overflow of electrons injected into the light-emitting layer 14 to the p-type semiconductor layer 15 at the interface with the light-emitting layer 14. The p-type semiconductor layer 15 may include a contact layer (not illustrated) to form an ohmic contact with an electrode. In this case, for example, the p-type semiconductor layer 15 only needs to include a GaN layer as a cladding layer between the electron-blocking layer and the contact layer.

In this embodiment, the p-type semiconductor layer 15 includes a first region 15A and a second region 15B in an upper surface 15U. The second region 15B is disposed outside the first region 15A and depressed from the first region 15A toward the light-emitting layer 14. The second region 15B includes an inactivated region 15C where p-type impurities are inactivated. As illustrated in FIG. 2, in this embodiment, the first region 15A projects from the second region 15B in a columnar shape.

For example, the first region 15A can be formed by performing dry etching on the upper surface 15U of the p-type semiconductor layer 15 with a circular region left. A surface of the semiconductor, such as the p-type semiconductor layer 15, containing impurities is roughened by dry etching. This inactivates the p-type impurities in the etched part, thus forming the inactivated region 15C.

Therefore, the second region 15B functions as a high resistance region HR having an electrical resistance higher than that of the first region 15A. Meanwhile, the region where etching is not performed, namely, the first region 15A, which is the region where the inactivated region 15C is not disposed, functions as a low resistance region LR. In the second region 15B, the p-type semiconductor layer 15 is partially removed by dry etching. Therefore, the second region 15B is depressed toward the light-emitting layer 14 side from the first region 15A.

In other words, the p-type semiconductor layer 15 includes the low resistance region LR and the high resistance region HR in the upper surface 15U. The high resistance region HR is depressed from the low resistance region LR toward the light-emitting layer 14 outside the low resistance region LR. The p-type impurities are inactivated in the high resistance region HR such that the high resistance region HR has the electrical resistance higher than that of the low resistance region LR.

The p-type semiconductor layer 15 functions as a current confinement layer that confines a current path from which a current is injected to the light-emitting structure layer EM. The first region 15A of the p-type semiconductor layer 15 functions as a current injected region from which a current is injected into the light-emitting layer 14. On the other hand, the second region 15B of the p-type semiconductor layer 15 functions as a non-current injected region from which the injection of a current into the light-emitting layer 14 is suppressed.

The surface emitting laser 10 includes a light-transmitting electrode layer 16 in contact with the first and the second regions 15A and 15B of the p-type semiconductor layer 15 and formed on the upper surface 15U of the p-type semiconductor layer 15. The light-transmitting electrode layer 16 is a conductive film having translucency to light emitted from the light-emitting layer 14. For example, the light-transmitting electrode layer 16 is made of a metal oxide film, such as ITO or IZO.

The surface emitting laser 10 includes an insulating layer 17 formed on the light-transmitting electrode layer 16. For example, the insulating layer 17 is made of a metal oxide, such as $Ta_2O_5$, $Nb_2O_5$, $ZrO_2$, $TiO_2$, and $HfO_2$. The insulating layer 17 has translucency to the light emitted from the light-emitting layer 14.

The surface emitting laser 10 includes a second multilayer film reflecting mirror (hereinafter simply referred to as a second reflecting mirror) 18 formed on the insulating layer 17. The second reflecting mirror 18 is disposed at a position facing the first reflecting film 12 via the light-emitting structure layer EM. A resonator OC having a direction perpendicular to the light-emitting structure layer EM (a direction perpendicular to the substrate 11) as a resonator length direction is constituted between the second reflecting mirror 18 and the first reflecting mirror 12.

In this embodiment, as illustrated in FIG. 2, the second reflecting mirror 18 has a column shape. Therefore, in this embodiment, the surface emitting laser 10 includes the column-shaped resonator OC.

In this embodiment, the second reflecting mirror 18 has a structure in which first dielectric films (hereinafter referred to as high refractive index dielectric films) H2 and second dielectric films (hereinafter referred to as low refractive index dielectric films) L2 having a refractive index lower than that of the high refractive index dielectric films H2 are stacked in alternation.

That is, in this embodiment, the second reflecting mirror 18 is a dielectric multilayer film reflecting mirror constituting a Distributed Bragg Reflector (DBR) made of a dielectric material. In this embodiment, the high refractive index dielectric film H2 is formed of a $Ta_2O_5$ layer, and the low refractive index dielectric film L2 is made of an $Al_2O_3$ layer.

The low resistance region LR and the high resistance region HR of the p-type semiconductor layer 15 in the light-emitting structure layer EM are disposed in the region between the first reflecting mirror 12 and the second reflecting mirror 18. That is, in this embodiment, the resonator OC includes: a central region R1 corresponding to the low resistance region LR of the p-type semiconductor layer 15 and extending between the first and the second reflecting mirrors 12 and 18, and an outer region R2 disposed corresponding to the high resistance region HR outside the central region R1.

In this embodiment, a layer thickness of the p-type semiconductor layer 15 in the first region 15A (low resistance region LR) is thicker (larger) than a layer thickness of the p-type semiconductor layer 15 in the second region 15B (high resistance region HR). Therefore, the outer region R2 in the resonator OC has an equivalent refractive index lower than that of the central region R1. That is, the central region R1 functions as a high refractive index region, and the outer region R2 functions as a low refractive index region having a refractive index lower than that of the central region R1. In this embodiment, the central region R1 has a column shape, and the outer region R2 has a cylindrical shape.

The surface emitting laser 10 includes first and second electrodes E1 and E2 that apply a current to the light-emitting structure layer EM. The first electrode E1 is formed on the n-type semiconductor layer 13. The second electrode E2 is formed on the light-transmitting electrode layer 16.

The application of a voltage between the first and the second electrodes E1 and E2 emits the light from the light-emitting layer 14 in the light-emitting structure layer EM. The light emitted from the light-emitting layer 14 repeats reflection between the first and the second reflecting mirrors 12 and 18, thus entering a resonance state (performing laser oscillation).

In this embodiment, the first reflecting mirror 12 has reflectance slightly lower than that of the second reflecting mirror 18. Therefore, a part of the light resonated between the first and the second reflecting mirrors 12 and 18 transmits through the first reflecting mirror 12 and the substrate 11 and is taken to the outside. Thus, the surface emitting laser 10 emits the light in the direction perpendicular to the substrate 11 and the light-emitting structure layer EM.

The first region 15A of the p-type semiconductor layer 15 defines a luminescence center in the light-emitting layer 14 and defines a center axis CA of the resonator OC. The center axis CA of the resonator OC passes through the center of the first region 15A and extends in the direction perpendicular to the p-type semiconductor layer 15 (light-emitting structure layer EM). In this embodiment, the center of the first region 15A of the p-type semiconductor layer 15 is disposed at a position corresponding to the center of the second region 15B.

Here, an exemplary configuration of each layer in the surface emitting laser 10 will be described. In this embodiment, the first reflecting mirror 12 is formed of 44 pairs of GaN layers and AlInN layers. The n-type semiconductor layer 13 has a layer thickness of 650 nm. The light-emitting layer 14 is formed of an active layer having a multiple quantum well structure in which 4 nm of InGaN layers and 5 nm of GaN layers are stacked three times. The second reflecting mirror 18 is formed of 10 pairs of $Ta_2O_5$ layers and $Al_2O_3$ layers.

The p-type semiconductor layer 15 has a layer thickness of 50 nm in the first region 15A. The p-type semiconductor layer 15 has a layer thickness of 40 nm in the second region 15B. The first region 15A has a width (outer diameter) of 6 μm.

Figure 3:
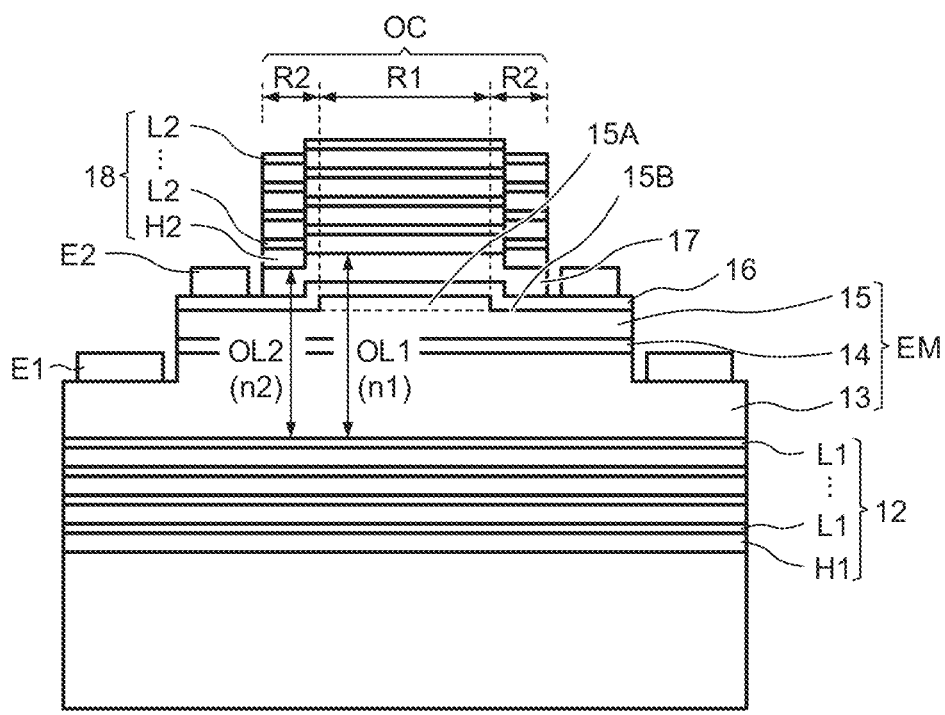
FIG. 3 is a drawing schematically illustrating a configuration of a resonator in the surface emitting laser according to Embodiment 1.

FIG. 3 is a drawing schematically illustrating an optical property of the resonator OC in the surface emitting laser 10. Although FIG. 3 is a cross-sectional view similar to FIG. 1, FIG. 3 omits hatchings. In this embodiment, as described above, the layer thickness of the p-type semiconductor layer 15 in the first region 15A (low resistance region LR) is larger than the layer thickness of the p-type semiconductor layer 15 in the second region 15B (high resistance region HR). The layer thicknesses of the other layers between the first and the second reflecting mirrors 12 and 18 are each constant.

Therefore, an equivalent refractive index n1 of the central region R1 in the resonator OC is higher than an equivalent refractive index n2 of the outer region R2. Additionally, an optical distance OL1 between the first and the second reflecting mirrors 12 and 18 in the central region R1 is larger than an optical distance OL2 in the outer region R2. That is, an equivalent resonator length in the central region R1 is longer than an equivalent resonator length in the outer region R2.

Figure 4:
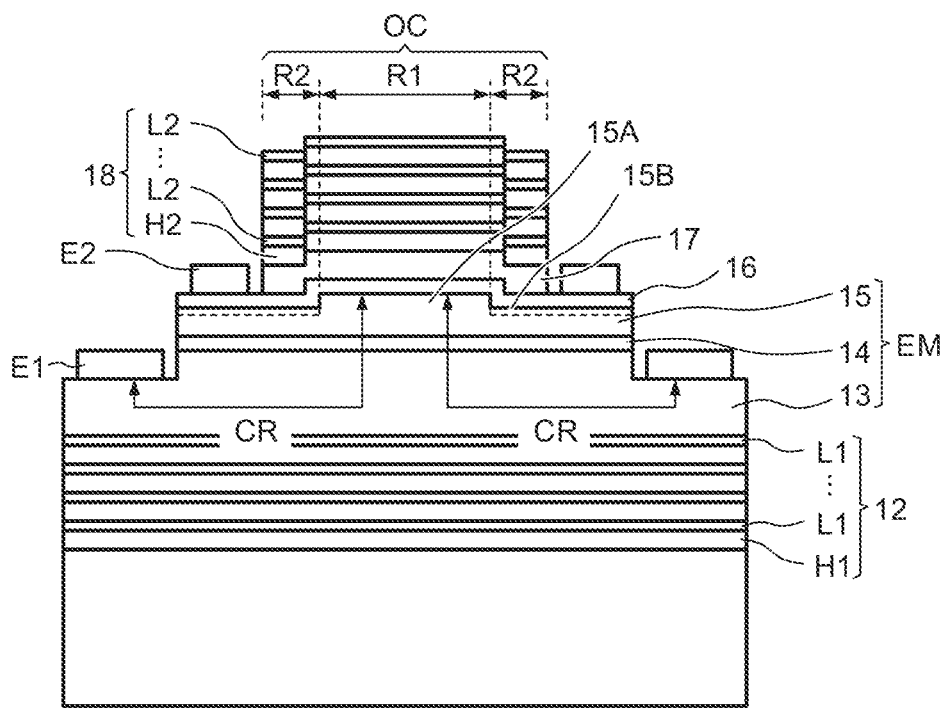
FIG. 4 is a drawing schematically illustrating current paths in the surface emitting laser according to Embodiment 1.

FIG. 4 is a drawing schematically illustrating an electrical property in the resonator OC (in the light-emitting structure layer EM) of the surface emitting laser 10. FIG. 4 is a drawing schematically illustrating paths of currents CR flowing through the inside of the light-emitting structure layer EM. Although FIG. 4 is a cross-sectional view similar to FIG. 1, FIG. 4 omits hatchings. In this embodiment, the central region R1 corresponding to the first region 15A functions as the low resistance region LR, and the outer region R2 corresponding to the second region 15B functions as the high resistance region HR.

Therefore, as illustrated in FIG. 4, the current CR is injected into the light-emitting layer 14 only in the central region R1, and the current is hardly injected into the light-emitting layer 14 in the outer region R2. That is, while light is generated (a gain is generated) in the central region R1, light is not generated in the outer region R2.

Figure 5:
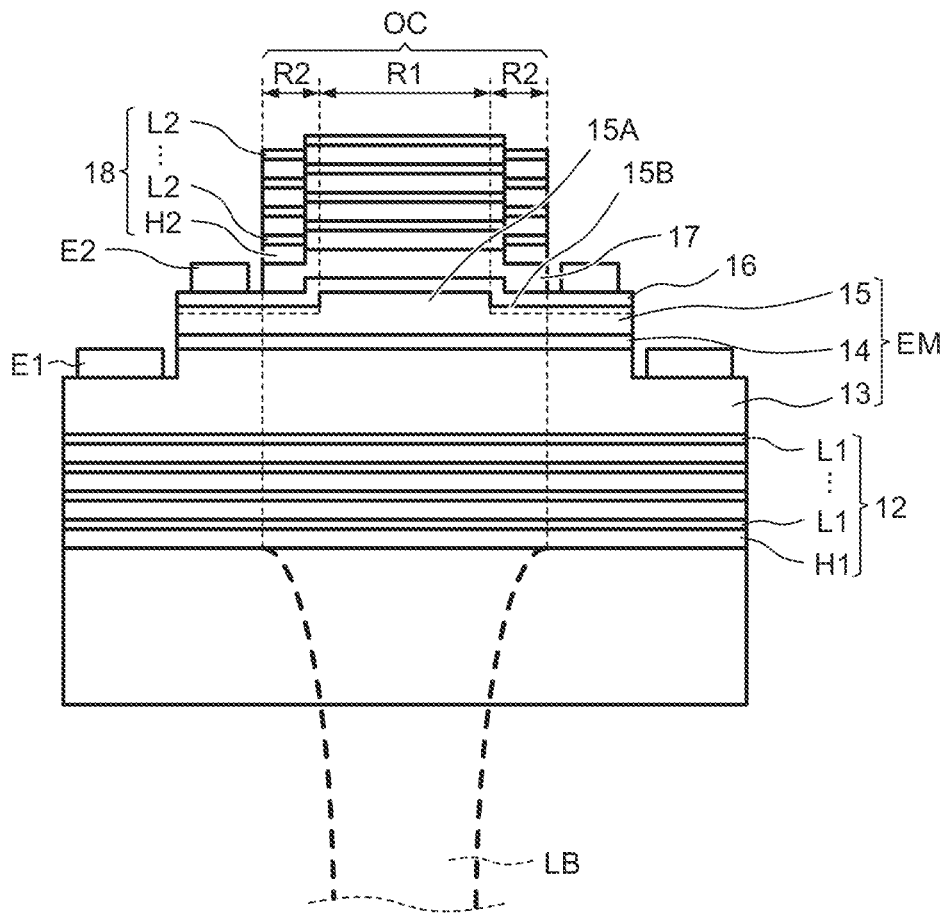
FIG. 5 is a drawing schematically illustrating light emitted from the surface emitting laser according to Embodiment 1.

FIG. 5 is a drawing schematically illustrating light emitted from the surface emitting laser 10. In this embodiment, a standing wave in the surface emitting laser 10 is taken to the outside from the first reflecting mirror 12. Here, as illustrated in FIG. 5, light resonated in the surface emitting laser 10 is taken to the outside while being converged at the central region R1. FIG. 5 schematically illustrates a beam outer edge of a laser beam LB emitted from the surface emitting laser 10 by the dashed line.

Specifically, first, in this embodiment the equivalent refractive index n2 of the resonator OC (laser medium) in the outer region R2 is smaller than the equivalent refractive index n1 of the resonator OC in the central region R1.

This suppresses an optical loss due to divergence (emission) of the standing wave in the resonator OC from the central region R1 to the outside. That is, a large amount of light remains in the central region R1, and the laser beam LB is taken to the outside in the state. Accordingly, a large amount of light concentrates on the proximity of the center axis CA of the resonator OC, thereby ensuring generating and emitting the laser beam LB with high output power.

In this embodiment, by providing the difference in equivalent refractive index, an optical confinement structure in the resonator OC is formed. Therefore, almost all light serves as the laser beams LB without causing deterioration of intensity. This allows highly efficiently generating and emitting the laser beam LB with high output power.

Next, in this embodiment, the low resistance region LR, that is, the current injected region to the light-emitting layer 14 is restricted to only the central region R1. That is, the current is not injected into the outer region R2, but the current injected region is disposed surrounding the non-current injected region. This allows stabilizing a transverse mode of the laser beam LB. For example, this allows emitting the unimodal laser beam LB.

Figure 6:
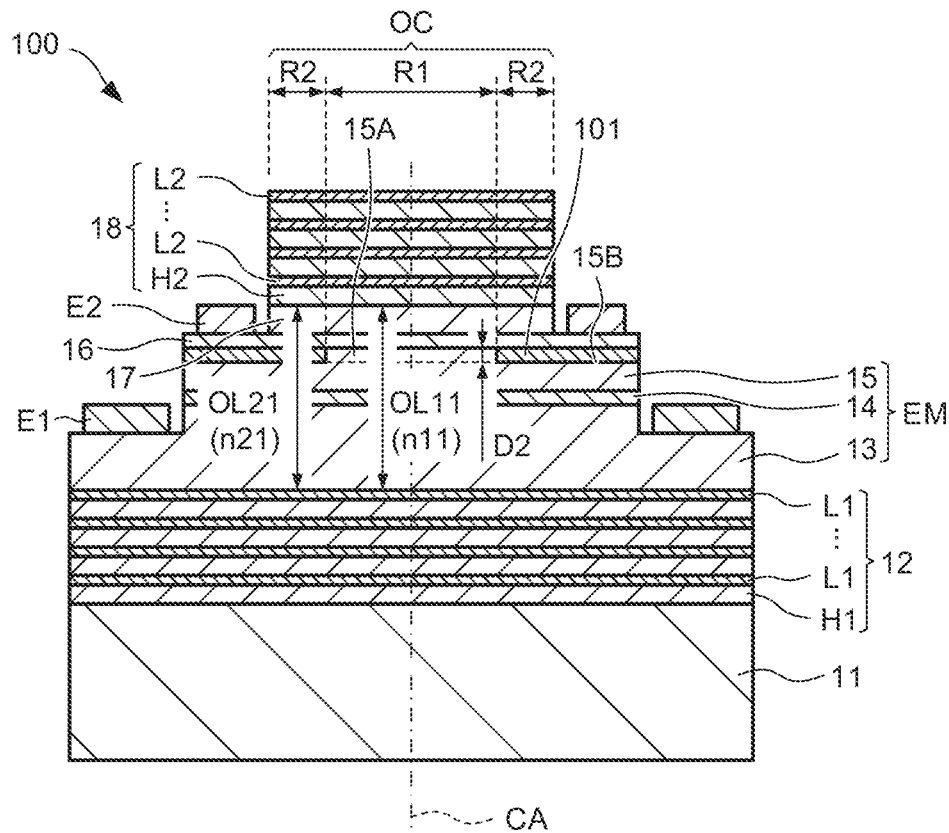
FIG. 6 is a cross-sectional view of a surface emitting laser according to Comparative Example.

FIG. 6 is a cross-sectional view of a surface emitting laser 100 according to Comparative Example 1. Except that the surface emitting laser 100 includes an insulating layer 101 on the second region 15B, the surface emitting laser 100 has a configuration similar to that of the surface emitting laser 10. In the surface emitting laser 100, the p-type semiconductor layer 15 contacts the insulating layer 101 in the second region 15B. The p-type semiconductor layer 15 contacts the light-transmitting electrode layer 16 in the first region 15A. The insulating layer 101 is made of $SiO_2$.

Figure 7:
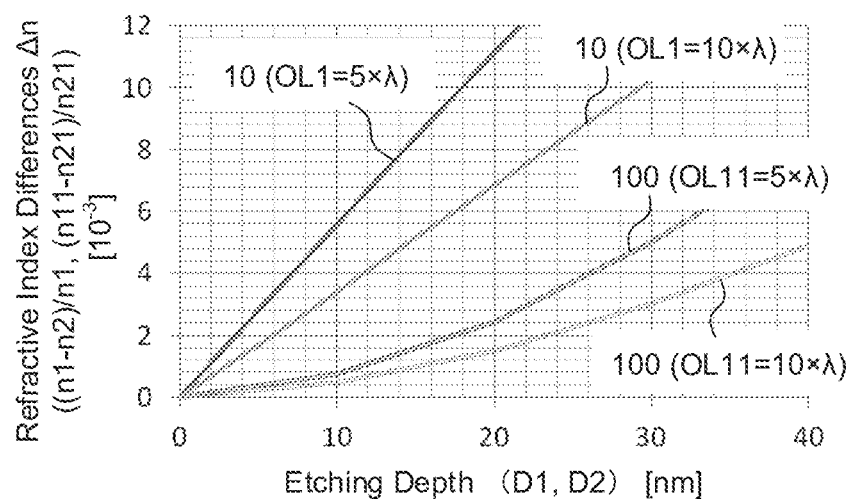
FIG. 7 is a drawing illustrating a relationship between etching depths of p-type semiconductor layers and formed refractive index differences in the surface emitting lasers according to Embodiment 1 and Comparative Example.

FIG. 7 is a drawing illustrating a relationship between etching depths at the upper surfaces 15U of the p-type semiconductor layers 15 in the surface emitting laser 10 and the surface emitting laser 100, that is, distances between the first and the second regions 15A and 15B in a direction perpendicular to the p-type semiconductor layers 15 (correspond to a depth D1 in the surface emitting laser 10 and a depth D2 in the surface emitting laser 100, see FIG. 1 and FIG. 6, respectively), and refractive index differences Δn, which are values found by dividing the differences in the equivalent refractive indexes between the central regions R1 and the outer regions R2 of both by the equivalent refractive indexes of the central regions R1 (the values correspond to (n1−n2)/n1 in the surface emitting laser 10 and (n11−n21)/n11 in the surface emitting laser 100, see FIG. 1 and FIG. 6, respectively).

FIG. 7 shows simulation results in a case where resonator lengths (corresponding to the optical distances OL1 and OL11, respectively, see FIG. 1 and FIG. 6) in both of the surface emitting lasers 10 and 100 are set to be five times or 10 times of a wavelength of the light (that is, the laser beam LB) emitted from the light-emitting layer 14.

As illustrated in FIG. 7, for example, when the refractive index difference Δn of $3 \times 10^{-3}$ is attempted to be obtained, in the surface emitting laser 100, the p-type semiconductor layer 15 needs to be etched such that the second region 15B becomes lower than the first region 15A by the depth D2, which is about 22 nm. On the other hand, it is seen that, in the surface emitting laser 10, the refractive index difference Δn of $3 \times 10^{-3}$ can be obtained by etching of only by the depth D1, which is about 5 nm. It is seen that the sufficient refractive index difference can also be formed by decreasing the etching depth D1 in all the other range in the surface emitting laser 10.

That is, in the surface emitting laser 10, by only removing the slight p-type semiconductor layer 15, the sufficient refractive index difference can be formed in the resonator OC compared with a case where, for example, the p-type semiconductor layer 15 is partially removed and then the insulating layer 101 is formed to form the refractive index difference in the resonator OC as in the surface emitting laser 100.

First, this eliminates the need for a process of forming the insulating layer 101, and therefore the manufacturing process of the surface emitting laser 10 is simplified. Next, an amount of the removed p-type semiconductor layer 15 (for example, an amount of etching and an etching period) is substantially reduced. This shortens the manufacturing period of the surface emitting laser 10.

Note that since the light-transmitting electrode layer 16 is formed on the first and the second regions 15A and 15B, for example, a step difference occurs in each layer from the light-transmitting electrode layer 16 to the second reflecting mirror 18 at the boundary between the central region R1 and the outer region R2. However, as described above, the step difference is slight (for example, 10 nm or less). Therefore, a scattering loss of the laser beam LB that possibly occurs due to the step difference in each layer is almost negligible.

Specifically, for example, when the wavelength of the laser beam LB is 445 nm and the equivalent refractive index n1 of the resonator OC in the central region R1 is 2.43, the step height (etching depth) D1 between the first and the second regions 15A and 15B is preferably, for example, 9.2 nm or less, and 4.7 nm or less is further preferred. This is because the step difference in the height range is insensitive to the laser beam LB. This embodiment eliminates the need for the insulating layer 101, thereby allowing forming a desired refractive index difference while achieving the range of the etching depth D1.

For example, considering the wavelength of the laser beam LB, the preferred ranges of the resonator length of the central region R1 and the refractive index difference between the central region R1 and the outer region R2 formed in the resonator OC may be determined, and the depth D1 of the second region 15B may be adjusted to meet the ranges. For example, considering obtaining the stable, unimodal far-field pattern for the laser beam LB at the wavelength of 445 nm, the refractive index difference is preferably provided between the central region R1 and the outer region R2 in a range of $1 \times 10^{-3}$ to $4 \times 10^{-3}$. In this case, for example, the depth D1 of the first region 15A is preferably in a range of from 1.5 to 12 nm. That is, the high resistance region HR is preferably depressed from the low resistance region LR toward the light-emitting layer 14 at the depth in of range of from 1.5 to 12 nm.

FIG. 8 is a drawing illustrating the far-field patterns and their properties of the laser beam LB emitted from the surface emitting laser 10 when respective driving conditions are adjusted. FIG. 8 shows measurement results when the width W1 (the width of the low resistance region LR and corresponding to the inner diameter in this embodiment, see FIG. 1) of the second region 15B is set to 6 μm, the resonator length OL1 is set to 10 times of a peak wavelength λ (445 nm in this embodiment) of the laser beam LB, and the refractive index difference Δn between the central region R1 and the outer region R2 is set to $1.5 \times 10^{-3}$.

As illustrated in FIG. 8, even when the driving was performed to obtain the optical output exceeding 5 mW, the unimodal far-field pattern was able to be obtained and its half-value angle was 6° or less. That is, it is seen that, in the operation under various driving conditions as well, the stable, unimodal laser beam LB can be emitted. Thus, it is seen that the surface emitting laser 10 can emit the laser beam LB in the stable transverse mode.

Figure 9:
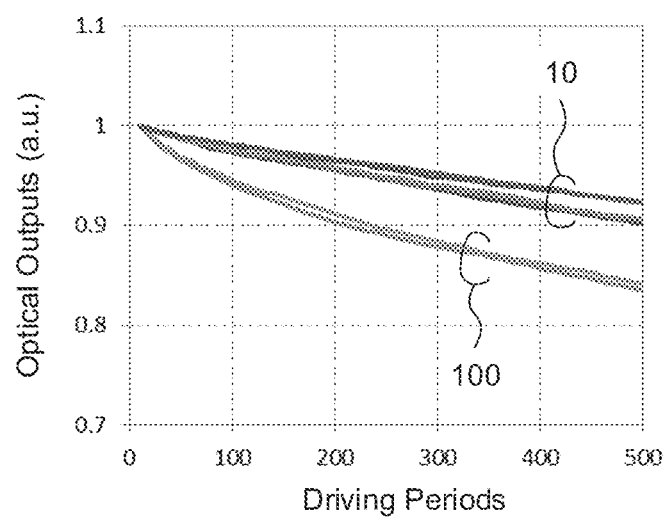
FIG. 9 is a drawing illustrating a relationship between driving periods and optical outputs in the surface emitting lasers according to Embodiment 1 and Comparative Example.

FIG. 9 is a drawing illustrating a relationship between the driving period and the optical output in the surface emitting lasers 10 and 100. FIG. 9 is a drawing illustrating the relationship between the driving period and the optical output of the surface emitting lasers 10 and 100 with the optical output at the start of the driving set to 1.

As illustrated in FIG. 9, it is seen that the reduction in optical output is suppressed in the surface emitting laser 10 compared with the surface emitting laser 100. That is, it is seen that the surface emitting laser 10 features the stable output characteristics and high quality compared with the surface emitting laser 100.

It is considered that this is caused by the surface emitting laser 10 not including the insulating layer 101, which is disposed in the surface emitting laser 100. Specifically, to form the insulating layer 101, the p-type semiconductor layer 15 (semiconductor wafer) is irradiated with plasma and stress is applied to the p-type semiconductor layer 15. Meanwhile, when the insulating layer 101 is not formed, damage given to the p-type semiconductor layer 15 is eliminated. Accordingly, it is considered that the surface emitting laser 10 maintaining the p-type semiconductor layer 15 in the high quality state can be obtained and the output characteristics are stabilized.

Thus, in this embodiment, the inactivated region 15C is disposed on the upper surface 15U of the p-type semiconductor layer 15 in the surface emitting laser 10, and thus the second region 15B that functions as the high resistance region HR is provided. Therefore, the laser beam LB in the high quality, stable transverse mode with high output power can be emitted.

In this embodiment, the case where the high resistance region HR and the low resistance region LR are disposed in the p-type semiconductor layer 15 has been described. However, the high resistance region HR and the low resistance region LR may be disposed in the n-type semiconductor layer 13.

In this embodiment, the case where the high resistance region HR is formed by dry etching has been described. However, the method for forming the high resistance region HR is not limited to dry etching. For example, the second region 15B in the p-type semiconductor layer 15 may be formed by slightly removing the surface of the p-type semiconductor layer 15 and ion implantation is performed to form the inactivated region 15C. Alternatively, the inactivated region 15C may be formed by ashing process.

Figure 10:
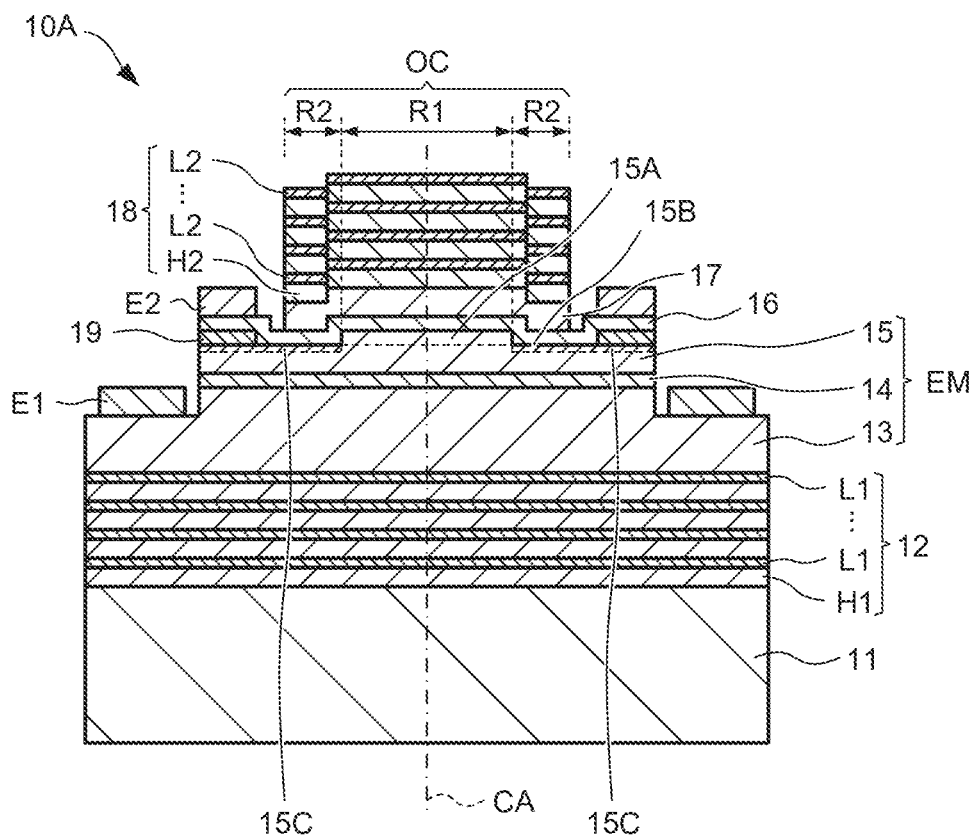
FIG. 10 is a cross-sectional view of a surface emitting laser according to modification of Embodiment 1.

FIG. 10 is a cross-sectional view of a surface emitting laser 10A according to modification of this embodiment. Except that the surface emitting laser 10A includes an insulating layer 19 on an outer peripheral portion of the first region 15A of the p-type semiconductor layer 15 between the p-type semiconductor layer 15 and the light-transmitting electrode layer 16, the surface emitting laser 10A has a configuration similar to that of the surface emitting laser 10.

In this modification, for example, the insulating layer 19 is formed on the outer peripheral portion of the second region 15B of the p-type semiconductor layer 15 having a region immediately below the second electrode E2, and the light-transmitting electrode layer 16 is formed so as to embed the insulating layer 19.

In this modification, partially forming the insulating layer 19 allows reliable insulation between the second region 15B and the light-transmitting electrode layer 16 while minimally suppressing damage to the p-type semiconductor layer 15. This allows reliably setting the second region 15B in the high resistance. Accordingly, a decrease in gain due to, for example, a leakage of a current in the second region 15B can be suppressed. Thus, the surface emitting laser 10A that emits the laser beam LB in that stable, high quality transverse mode with high output power is obtained.

Thus, in this embodiment, the surface emitting laser 10 includes the substrate 11, the first reflecting mirror 12, the n-type semiconductor layer (the first semiconductor layer having a first conductivity type) 13, the light-emitting layer 14, the p-type semiconductor layer (second semiconductor layer) 15, the light-transmitting electrode layer 16, and the second reflecting mirror 18. The first reflecting mirror 12 is formed on the substrate 11. The n-type semiconductor layer 13 is formed on the first reflecting mirror 12. The light-emitting layer 14 is formed on the n-type semiconductor layer 13. The p-type semiconductor layer 15 is formed on the light-emitting layer 14 and has a p-type conductivity type (second conductivity type) opposite to the first conductivity type of the n-type semiconductor layer 13. The p-type semiconductor layer 15 includes the low resistance region LR and the high resistance region HR on the upper surface 15U. The high resistance region HR is depressed from the low resistance region LR toward the light-emitting layer 14 outside the low resistance region LR and p-type impurities are inactivated in the high resistance region HR such that the high resistance region HR has the electrical resistance higher than the electrical resistance of the low resistance region LR. The light-transmitting electrode layer 16 in contact with the low resistance region LR and the high resistance region HR is formed on the upper surface 15U of the p-type semiconductor layer 15. The second reflecting mirror 18 is formed on the light-transmitting electrode layer 16. The resonator OC is constituted between the second reflecting mirror 18 and the first reflecting mirror 12. This allows emitting the light in the stable transverse mode and therefore allows providing the high quality surface emitting laser 10 (vertical cavity surface emitting device) having the simple configuration.

Embodiment 2

Figure 11:
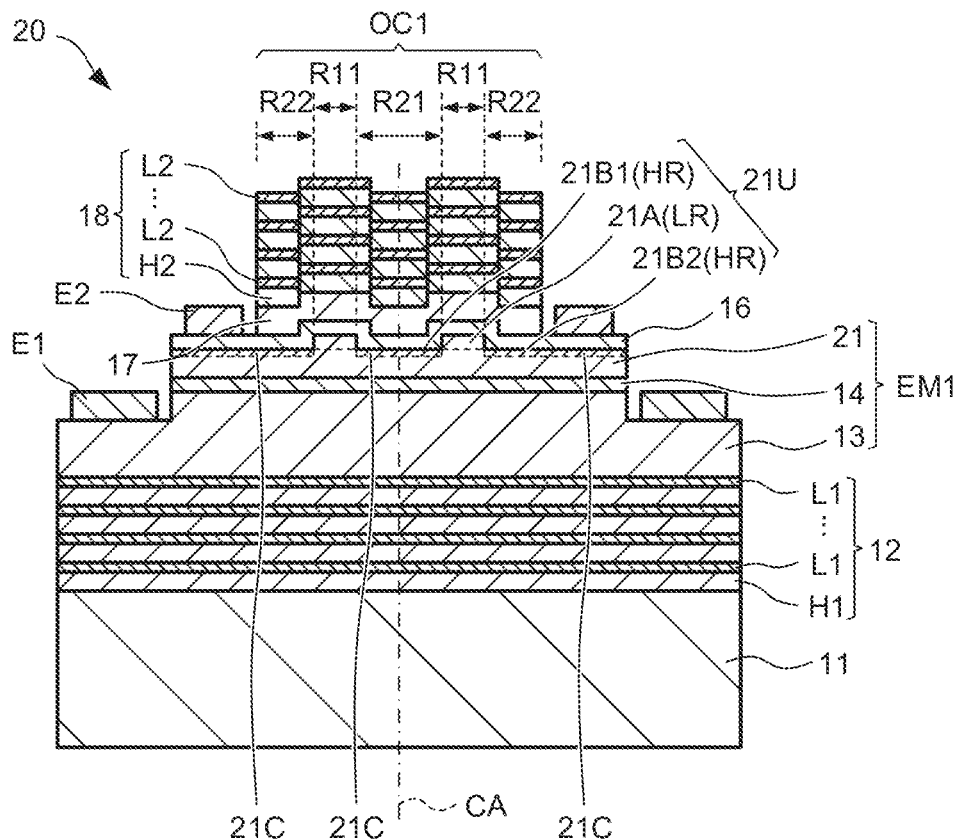
FIG. 11 is a cross-sectional view of a surface emitting laser according to Embodiment 2.
Figure 12:
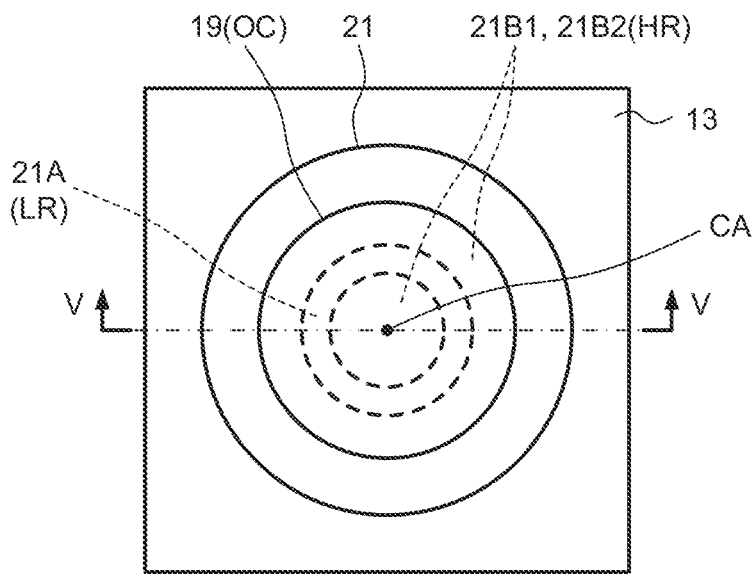
FIG. 12 is a schematic top view of the surface emitting laser according to Embodiment 2.

FIG. 11 is a cross-sectional view of a surface emitting laser 20 according to Embodiment 2. FIG. 12 is a schematic top view of the surface emitting laser 20. Except for a configuration of a light-emitting structure layer EM1, the surface emitting laser 20 has a configuration similar to that of the surface emitting laser 10.

In this embodiment, the light-emitting structure layer EM1 includes a p-type semiconductor layer 21 that includes the high resistance region HR inside the low resistance region LR on an upper surface 21U. Specifically, in the p-type semiconductor layer 21, the low resistance region LR is disposed in a ring shape and the high resistance regions HR are disposed in both the inside and the outside of the low resistance region LR.

In this embodiment, the p-type semiconductor layer 21 includes a first region 21A disposed in the ring shape on an upper surface 21U and functioning as the low resistance region LR, a second region 21B1 depressed from the first region 21A toward the light-emitting layer 14 at the inside of the first region 21A and functioning as the high resistance region HR, and a third region 21B2 depressed from the first region 21A toward the light-emitting layer 14 at the outside of the first region 21A and functioning as the high resistance region HR.

For example, the p-type semiconductor layer 21 can be formed by performing dry etching on the surface of the p-type semiconductor layer 21 with the ring-shaped region left. For example, the ring-shaped region as the first region 21A has an outer diameter of 10.3 μm and an inner diameter of 3.5 μm.

In this embodiment, a resonator OC1 includes a ring-shaped region R11 corresponding to the first region 21A, an inner region R21 corresponding to the second region 21B1 disposed inside the ring-shaped region R1, and an outer region R22 corresponding to the third region 21B2 disposed outside the ring-shaped region R11. The inner region R21 and the outer region R22 have equivalent refractive indexes lower than that of the ring-shaped region R11. As illustrated in FIG. 12, the inner region R21 is formed in a columnar shape, and the ring-shaped region R11 and the outer region R22 are formed in a cylindrical shape.

In this embodiment, a current flows only through the ring-shaped region R11. The current confinement is performed on the resonator OC1 by thus disposing the inner region R21 to ensure stabilizing an eigenmode (also referred to as a supermode) of the laser beam LB. Specifically, for example, adjustment of the width (a width of the first region 21A corresponding to the width of the current injected region) of the ring-shaped region R11 allows stably generating the laser beam LB in various eigenmodes.

Thus, in this embodiment, the p-type semiconductor layer 21 includes the high resistance region HR in which an inactivated region 21C is formed inside the low resistance region LR. This allows emitting the light in the stable transverse mode and therefore allows providing the high quality surface emitting laser 20 (vertical cavity surface emitting device) having the simple configuration.

DESCRIPTION OF REFERENCE SIGNS 10, 10A, 20 surface emitting laser (vertical cavity surface emitting device)
15, 21 p-type semiconductor layer
15C, 21C inactivated region

The invention claimed is:

1. A vertical cavity surface emitting device comprising:
a substrate;
a first multilayer film reflecting mirror formed on the substrate;
a first semiconductor layer formed on the first multilayer film reflecting mirror and having a first conductivity type;
a light-emitting layer formed on the first semiconductor layer;
a second semiconductor layer formed on the light-emitting layer and having a second conductivity type opposite to the first conductivity type of the first semiconductor layer, the second semiconductor layer including a low resistance region and a high resistance region on an upper surface thereof, the high resistance region being depressed from the low resistance region toward the light-emitting layer outside the low resistance region, and impurities of the second conductivity type being inactivated in the high resistance region such that the high resistance region has an electrical resistance higher than an electrical resistance of the low resistance region;
a light-transmitting electrode layer in contact with the low resistance region and the high resistance region, the light-transmitting electrode layer being formed on the upper surface of the second semiconductor layer; and
a second multilayer film reflecting mirror formed on the light-transmitting electrode layer,
wherein:
a resonator is constituted between the second multilayer film reflecting mirror and the first multilayer film reflecting mirror, the second semiconductor layer includes another high resistance region,
the another high resistance region is depressed from the low resistance region toward the light-emitting layer inside the low resistance region on the upper surface, and
impurities of the second conductivity type are inactivated in the another high resistance region such that the another high resistance region has an electrical resistance higher than the electrical resistance of the low resistance region.

2. The vertical cavity surface emitting device according to claim 1, wherein:
the resonator includes a central region and an outer region, the central region corresponds to the low resistance region and extends between the first and the second multilayer film reflecting mirrors, and the outer region is disposed corresponding to the high resistance region outside the central region, and
the outer region has an equivalent refractive index lower than an equivalent refractive index of the central region.

3. The vertical cavity surface emitting device according to claim 1, wherein:
the resonator includes a ring-shaped region, an inner region, and an outer region, the ring-shaped region corresponds to the low resistance region and extends between the first and the second multilayer film reflecting mirrors, the inner region is disposed corresponding to the another high resistance region inside the ring-shaped region, and the outer region is disposed corresponding to the high resistance region outside the ring-shaped region, and
the inner region and the outer region have equivalent refractive indexes lower than an equivalent refractive index of the ring-shaped region.

4. The vertical cavity surface emitting device according to claim 1, wherein the high resistance region is depressed from the low resistance region toward the light-emitting layer by a depth in a range of from 1.5 to 12 nm.

5. The vertical cavity surface emitting device according to claim 1, wherein the substrate has a composition of GaN.

6. The vertical cavity surface emitting device according to claim 1, wherein the first multilayer film reflecting mirror is a Distributed Bragg Reflector including a high refractive index semiconductor layer having a composition of GaN and a low refractive index semiconductor layer having a composition of AlInN.

7. The vertical cavity surface emitting device according to claim 1, wherein the first semiconductor layer, the light-emitting layer and the second semiconductor layer are a plurality of semiconductor layers made of a nitride-based semiconductor.

8. The vertical cavity surface emitting device according to claim 1, further comprising an insulating layer between the light-transmitting electrode layer and the second multilayer film reflecting mirror.

9. The vertical cavity surface emitting device according to claim 1, wherein:
the first multilayer film reflecting mirror has a reflectance lower than a reflectance of the second multilayer film reflecting mirror, and
light resonated in the resonator transmits through the first multilayer film reflecting mirror and the substrate and is emitted to outside.

10. The vertical cavity surface emitting device according to claim 1, further comprising an insulating layer between the high resistance region of the second semiconductor layer and the light-transmitting electrode layer.

11. The vertical cavity surface emitting device according to claim 1, wherein the impurities of the second conductivity type in the high resistance regions are inactivated by a dry etching process.

12. The vertical cavity surface emitting device according to claim 1, wherein the impurities of the second conductivity type in the high resistance regions are inactivated by an ion implantation process.

13. The vertical cavity surface emitting device according to claim 1, wherein the impurities of the second conductivity type in the high resistance regions are inactivated by an ashing process.

14. The vertical cavity surface emitting device according to claim 2, wherein a refractive index difference $\Delta n$ obtained by the formula $\Delta n=(n1-n2)/n1$ is in a range of $1\times10^{-3}$ to $4\times10^{-3}$,
where:
n1 represents the equivalent refractive index of the central region, and
n2 represents the equivalent refractive index of the outer region.

15. A vertical cavity surface emitting device comprising:
a substrate;
a first multilayer film reflecting mirror formed on the substrate;
a first semiconductor layer formed on the first multilayer film reflecting mirror and having a first conductivity type;
a light-emitting layer formed on the first semiconductor layer;
a second semiconductor layer formed on the light-emitting layer and having a second conductivity type opposite to the first conductivity type of the first semiconductor layer, the second semiconductor layer including a low resistance region and a high resistance region on an upper surface thereof, the high resistance region being depressed from the low resistance region toward the light-emitting layer outside the low resistance region, and impurities of the second conductivity type being inactivated in the high resistance region such that the high resistance region has an electrical resistance higher than an electrical resistance of the low resistance region;
a light-transmitting electrode layer in contact with the low resistance region and the high resistance region, the light-transmitting electrode layer being formed on the upper surface of the second semiconductor layer; and
a second multilayer film reflecting mirror formed on the light-transmitting electrode layer,
wherein:
a resonator is constituted between the second multilayer film reflecting mirror and the first multilayer film reflecting mirror, and
the high resistance region is depressed from the low resistance region toward the light-emitting layer by a depth in a range of from 1.5 to 12 nm.

16. The vertical cavity surface emitting device according to claim 15, wherein:
the resonator includes a central region and an outer region, the central region corresponds to the low resistance region and extends between the first and the second multilayer film reflecting mirrors, and the outer region is disposed corresponding to the high resistance region outside the central region, and the outer region has an equivalent refractive index lower than an equivalent refractive index of the central region.

17. The vertical cavity surface emitting device according to claim 15, wherein the substrate has a composition of GaN.

18. The vertical cavity surface emitting device according to claim 15, wherein the first multilayer film reflecting mirror is a Distributed Bragg Reflector including a high refractive index semiconductor layer having a composition of GaN and a low refractive index semiconductor layer having a composition of AlInN.

19. The vertical cavity surface emitting device according to claim 15, wherein the first semiconductor layer, the light-emitting layer and the second semiconductor layer are a plurality of semiconductor layers made of a nitride-based semiconductor.

20. The vertical cavity surface emitting device according to claim 15, further comprising an insulating layer between the light-transmitting electrode layer and the second multilayer film reflecting mirror.

21. The vertical cavity surface emitting device according to claim 15, wherein:
the first multilayer film reflecting mirror has a reflectance lower than a reflectance of the second multilayer film reflecting mirror, and
light resonated in the resonator transmits through the first multilayer film reflecting mirror and the substrate and is emitted to outside.

22. The vertical cavity surface emitting device according to claim 15, further comprising an insulating layer between the high resistance region of the second semiconductor layer and the light-transmitting electrode layer.

23. A vertical cavity surface emitting device comprising:
a substrate;
a first multilayer film reflecting mirror formed on the substrate;
a first semiconductor layer formed on the first multilayer film reflecting mirror and having a first conductivity type;
a light-emitting layer formed on the first semiconductor layer;
a second semiconductor layer formed on the light-emitting layer and having a second conductivity type opposite to the first conductivity type of the first semiconductor layer, the second semiconductor layer including a low resistance region and a high resistance region on an upper surface thereof, the high resistance region being depressed from the low resistance region toward the light-emitting layer outside the low resistance region, and impurities of the second conductivity type being inactivated in the high resistance region such that the high resistance region has an electrical resistance higher than an electrical resistance of the low resistance region;
a light-transmitting electrode layer in contact with the low resistance region and the high resistance region, the light-transmitting electrode layer being formed on the upper surface of the second semiconductor layer; and
a second multilayer film reflecting mirror formed on the light-transmitting electrode layer,
wherein:
a resonator is constituted between the second multilayer film reflecting mirror and the first multilayer film reflecting mirror,
the resonator includes a central region and an outer region, the central region corresponds to the low resistance region and extends between the first and the second multilayer film reflecting mirrors, and the outer region is disposed corresponding to the high resistance region outside the central region, the outer region has an equivalent refractive index lower than an equivalent refractive index of the central region, and a refractive index difference Δn obtained by the formula Δn=(n1−n2)/n1 is in a range of $1 \times 10^{-3}$ to $4 \times 10^{-3}$, where:

n1 represents the equivalent refractive index of the central region, and n2 represents the equivalent refractive index of the outer region.

* * * * *